US011651203B2

(12) United States Patent
Nikonov et al.

(10) Patent No.: US 11,651,203 B2
(45) Date of Patent: *May 16, 2023

(54) THREE-DIMENSIONAL OSCILLATOR STRUCTURE

(71) Applicant: Intel Corporation, Santa Clara, CA (US)

(72) Inventors: Dmitri E. Nikonov, Beaverton, OR (US); Elijah V. Karpov, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/555,382

(22) Filed: Dec. 18, 2021

(65) Prior Publication Data
US 2022/0114432 A1    Apr. 14, 2022

Related U.S. Application Data

(63) Continuation of application No. 16/144,952, filed on Sep. 27, 2018, now Pat. No. 11,250,317.

(51) Int. Cl.
G06N 3/063     (2006.01)
H03B 5/20      (2006.01)
(Continued)

(52) U.S. Cl.
CPC .......... *G06N 3/0635* (2013.01); *G06N 3/049* (2013.01); *H01L 45/1233* (2013.01); *H03B 1/02* (2013.01);
(Continued)

(58) Field of Classification Search
CPC . H03B 1/02; H03B 5/20; H03B 28/00; H03B 29/00; H03B 7/00; H03B 7/06;
(Continued)

(56) References Cited

U.S. PATENT DOCUMENTS 11,250,317 B2 *   2/2022  Nikonov ............. G06N 3/0635
2018/0226453 A1 * 8/2018  Yi ...................... H01L 27/265
(Continued)

OTHER PUBLICATIONS

Shukla, N., et al. "Computing with coupled relaxation oscillators." Future Trends in Microelectronics: Journey into the Unknown (2016): 147-156. (Year: 2016).*

(Continued)

Primary Examiner — Ryan Johnson
(74) Attorney, Agent, or Firm — Akona IP PC

(57) ABSTRACT

Embodiments may relate to a structure to be used in a neural network. A first column and a second column, both of which are to couple with a substrate. A capacitor structure may be electrically coupled with the first column. An insulator-metal transition (IMT) structure may be coupled with the first column such that the capacitor structure is electrically positioned between the IMT structure and the first column. A resistor structure may further be electrically coupled with the IMT structure and the second column such that the resistor structure is electrically positioned between the second column and the IMT structure. Other embodiments may be described or claimed.

20 Claims, 7 Drawing Sheets

(51) Int. Cl.
*H01L 45/00* (2006.01)
*H03K 4/787* (2006.01)
*H03B 1/02* (2006.01)
*H03B 7/00* (2006.01)
*G06N 3/04* (2006.01)
*G06N 3/049* (2023.01)

(52) U.S. Cl.
CPC ............... *H03B 5/20* (2013.01); *H03B 7/00* (2013.01); *H03K 4/787* (2013.01)

(58) Field of Classification Search
CPC ...... H03K 4/787; G06N 3/063; G06N 3/0635; G06N 3/049; H01L 45/1233; H01L 45/04
See application file for complete search history.

(56) References Cited

U.S. PATENT DOCUMENTS

2018/0232628 A1* 8/2018 Park .................. G06N 3/063
2019/0036023 A1* 1/2019 Yi .................... H01L 45/146

OTHER PUBLICATIONS

Parihar, Abhinav, et al. "Computational paradigms using oscillatory networks based on state-transition devices." 2017 International Joint Conference on Neural Networks (IJCNN). IEEE, 2017. (Year: 2017).*

Chen, Pai-Yu, et al. "Compact oscillation neuron exploiting metal-insulator-transition for neuromorphic computing." 2016 IEEE/ACM International Conference on Computer-Aided Design (ICCAD). IEEE, 2016. (Year: 2016).*

* cited by examiner

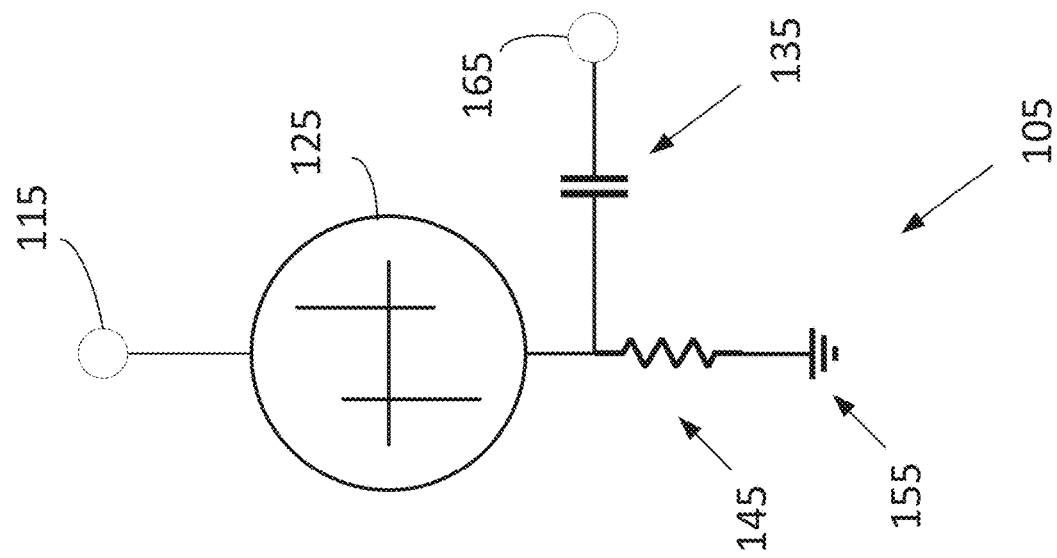
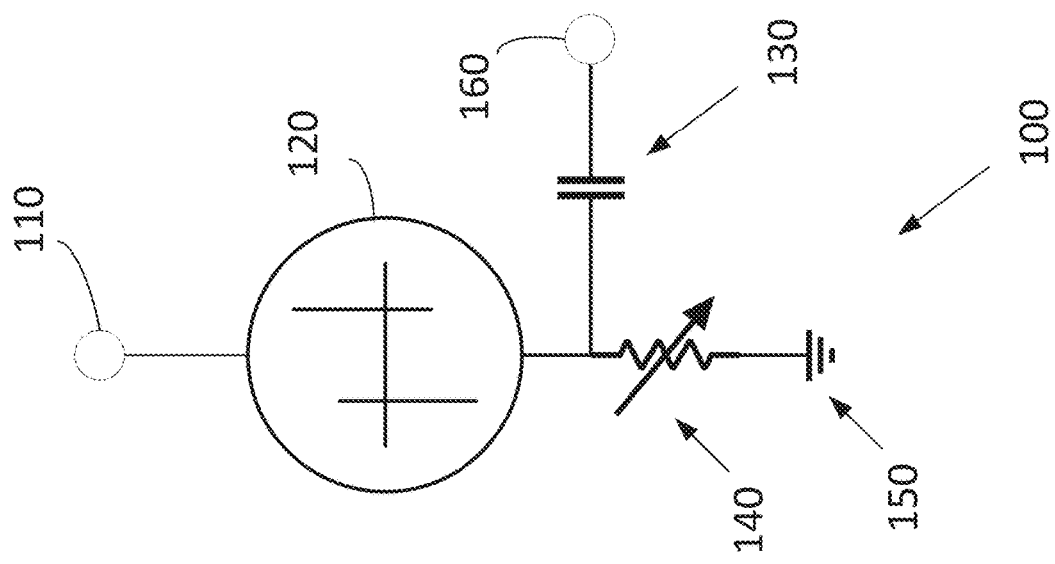
Figure 1

Coupling a first column with a substrate, wherein the column is parallel to a vertical axis of the structure, and wherein the vertical axis is perpendicular to a lateral axis of the structure
605

Coupling a second column to the substrate, wherein the second column is parallel to the first column
610

Coupling a first oscillator to the first column and the second column, wherein the first oscillator is at a first location along the vertical axis
615

Coupling a second oscillator to the first column and the second column, wherein the second oscillator is at a second location along the vertical axis
620

Figure 6

THREE-DIMENSIONAL OSCILLATOR STRUCTURE

CROSS REFERENCE TO RELATED APPLICATION

This application is a continuation of U.S. application Ser. No. 16/144,952, filed Sep. 27, 2018, which is incorporated by reference its entirety.

BACKGROUND

Neural networks may enable a wide range of computing tasks, for example, tasks related to artificial intelligence or machine learning. One option for neural network hardware may be oscillator neural networks (ONN). An ONN may include a plurality of oscillators communicatively coupled with an averager (e.g., a common node). The oscillators may work as synapses and the averager may work as a neuron connecting the synapses. The various synapses may hold respective weights G, and accept inputs F. The weights and inputs may determine a voltage which may shift the oscillators frequencies. The output of the ONN may be the amplitude of an alternating current (AC) signal, which may measure the degree of match (DOM) of the input pattern and weights.

However, some ONNs may suffer from one or more drawbacks. One drawback may be that the ONN may require a significant number of oscillators to form an array. For example, some ONNs may require hundreds of oscillators. Additionally, many ONNs may use complementary metal oxide semiconductor (CMOS) oscillators, which may be relatively large. This results in the need for multiple interconnecting wires which are difficult to route. Therefore, an ONN that uses hundreds of CMOS oscillators may have a very large footprint.

BRIEF DESCRIPTION OF THE DRAWINGS

FIG. 1 depicts an example simplified circuit diagram of an oscillator, in accordance with various embodiments.

FIG. 6 depicts an example technique for generating a structure to be used in an ONN, in accordance with various embodiments.

DETAILED DESCRIPTION

Figure 2:
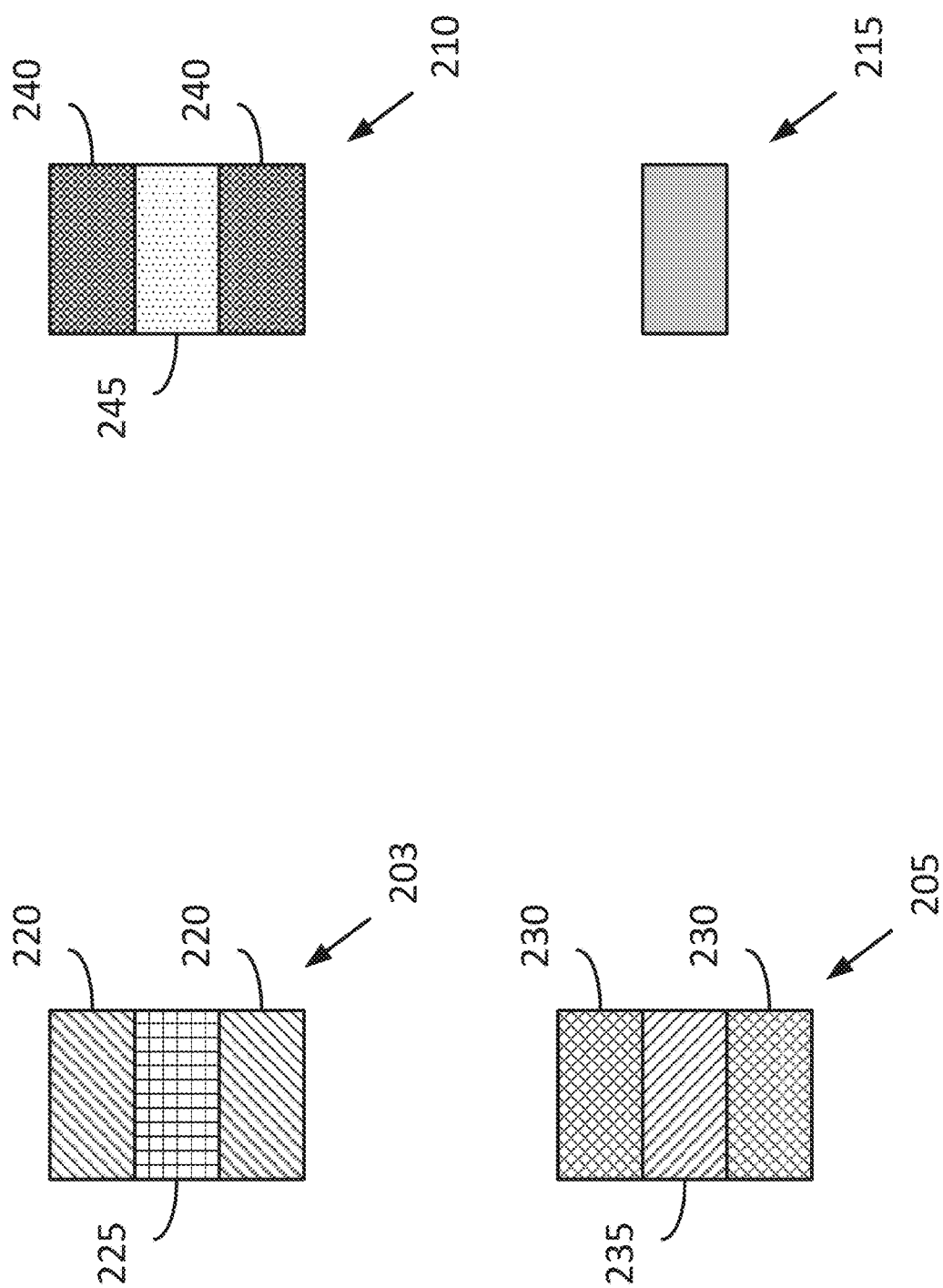
FIG. 2 depicts an example simplified cross-sectional view of various structures that may be used in an oscillator, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise.

As noted above, CMOS based oscillators may be relatively large. For example, some CMOS oscillators may be on the order of a few to hundreds of micrometers ("microns" or "μm") squared. However, oxide-based oscillators may be significantly smaller than the CMOS based oscillators. Some oxide-based oscillators may be based on oxides which exhibit an insulator-metal transition (IMT). Generally, IMT may refer to a phenomenon of a dramatic change of the resistance of the material in response to temperature, voltage, or strain. In some embodiments, one polarity of applied voltage to the IMT material may result in a transition from a high-resistance state (HRS) to a low resistance state (LRS) above a certain threshold absolute value of voltage. The opposite polarity of applied voltage to the IMT material may result in a transition from LRS to HRS above a certain threshold absolute of voltage. This may amount to a hysteresis in the current-voltage characteristic of a device with a salient "figure-8" shape.

Some legacy devices may include oxide oscillators positioned in the plane of the substrate. They may require additional circuit elements such as resistors or coupling capacitors. Additionally, many legacy devices have only coupled two oxide oscillators together, which may not be appropriate for use in an ONN which may require hundreds of oscillators.

By contrast, embodiments herein may relate to three-dimensional (3D) structures in which oscillators are placed between multiple metal interconnect layers. The averager and the ground may be routed vertically, and the oscillator input connections may be routed horizontally. These 3D structures may provide a very high density of oscillators in a relatively small integrated circuit area, which may be useful in ONNs. Additionally, in the structures, it may be easier to connect oscillators to various inputs, memory cells, averagers, or the ground in three dimensions rather than two. This higher density and ease of interconnection may result in smaller circuits which use shorter wires, which may improve delay of the circuit or energy use.

Generally, embodiments herein may relate to an oscillator that may be used in a neural network such as an ONN. The oscillator may include a nonlinear hysteretic element and a resistor coupled together in series. An input voltage may be applied to the hysteretic element. The output oscillating voltage may be produced at the note between the hysteretic element in the resistor. The oscillator may be coupled to an averager via a coupling capacitor.

FIG. 1 depicts an example simplified circuit diagram of an oscillator, in accordance with various embodiments. Specifically, FIG. 1 depicts two alternative circuit diagrams of an oscillator 100 and 105.

Specifically, in oscillator 100, an input voltage may be provided at input node 110. The voltage may be provided from the input node 110 to the hysteretic element 120. The hysteretic element 120 may be coupled with a variable resistor 140 and a capacitor 130. As used herein, a variable resistor may refer to a resistor whose resistance may change based on one or more internal or external factors. The variable resistor 140 may further be coupled with ground 150, while the capacitor 130 is coupled with an output node 160 of the oscillator 100.

Generally, the hysteretic element 120 may be configured to provide an oscillating voltage. The frequency of the oscillating voltage may be based on two elements. First, the frequency of the oscillating voltage may be based on the input voltage received by the input node 110. This input voltage may be akin to the input F described above. The weight, G, may be considered to be a value of the variable resistor 140.

Similarly, oscillator 105 may include an input node 115, a hysteretic element 125, a capacitor 135, ground 155, and an output node 165, which may be respectively similar to input node 110, hysteretic element 120, capacitor 130, ground 150, and output node 160. Further, oscillator 105 may include a fixed resistor 145. As used herein, a fixed resistor may refer to a resistor whose resistance is preset.

Similarly to oscillator 100, hysteretic element 125 may be configured to provide an oscillating voltage. Again, the frequency of the oscillating voltage may be based on two elements, an input F and a weight G. However, because the resistor 145 is a fixed resistor, the value of the resistor 145 may not be used for input of signals related to the weights. Rather, the weights may be stored remotely, and the input voltage received by input node 115 may be based on a difference between an input pattern F and a weight G obtained in a separate logic circuit. By varying the input voltage received at input node 115, the output frequency of the oscillator 105 may be controlled.

FIG. 2 depicts an example simplified cross-sectional view of various structures that may be used in an oscillator, in accordance with various embodiments. Specifically, FIG. 2 depicts a hysteretic element 203, a capacitor 205, a variable resistor 210, and a fixed resistor 215 which may respectively be similar to hysteretic elements 120 or 125, capacitors 130 or 135, variable resistor 140, or fixed resistor 145.

The hysteretic element 203 may include an IMT switch material 225 between two electrodes 220. The electrodes 220 may be, for example, a conductive material such as copper or some other material. The IMT switch material 225 may be, for example, an oxide material such as vanadium dioxide ($VO_2$), niobium dioxide ($NbO_2$), tantalum dioxide ($TaO_2$), titanium oxide ($Ti_3O_5$), titanium (III) oxide ($Ti_2O_3$), lanthanum carbonate ($LaCo_3$), samarium nickelate ($SmNiO_3$), or some other appropriate material that exhibits IMT such as chalcogenide-based threshold switches. Such threshold switch materials are alloys which include sulfur (S), selenium (Se), or tellurium (Te).

The capacitor 205 may include a dielectric material 235 between two electrodes 230. Similarly to electrodes 220, electrodes 230 may be formed of a conductive material such as copper or some other conductive material. The dielectric material 235 may be, for example, porcelain, ceramic, mica, glass, plastic, or an oxide material.

The variable resistor 210 may include a variably resistive element 245 between two electrodes 240. Similarly to electrodes 220, electrodes 240 may be formed of a conductive material such as copper or some other conductive material. In some embodiments, the variably resistive element 245 may be a phase change material. For example, the phase change material may be a chalcogenide glass such as germanium-antimony-tellurium ($Ge_xSb_yTe_z$ or GST) which may be doped by additional elements such as silicon (Si), indium (In), or some other dopant material. Additionally or alternatively, the variably resistive element 245 may include a filamentary oxygen vacancy resistive switching material such as those based on tantalum pentoxide ($Ta_2O_5$), hafnium dioxide ($HfO_2$), or some other oxide. Additionally or alternatively, the variably resistive element 245 may include an interfacial resistive switching material such as a material based on a conductive oxide. Indium tin oxide is an example of a conductive oxide. A different type of a conductive oxide may be a sub-stoichiometric oxide, such as titanium sub-oxide ($TiO_{2-x}$). Additionally or alternatively, the variably resistive element 245 may be a conductive bridge filament material stuck such as based on copper (Cu), silver (Ag), or cobalt (Co) electrodes in contact with an atomic layer deposition (ALD) oxide such as aluminum oxide ($Al_2O_3$), silicon oxide ($SiO_2$), $HfO_2$, etc. It will, however, be understood that the above-listed oxide-based materials are intended as example materials, and other embodiments may use a non-oxide-based material that exhibits IMT properties.

Generally, the resistive element 245 may act as a sort of random-access memory (RAM). For example, in some embodiments the resistive element 245 may act similar to a resistive RAM (RRAM). In other embodiments, the resistive element 245 may act as a conductive bridge RAM (CBRAM).

In some embodiments, the variable resistor 210 may be replaced by a floating gate transistor for which channel resistance may be varied by a charge stored on the floating gate. Generally, it will be understood that embodiments that are discussed herein with respect to a variable resistor may act similarly if the variable resistor is replaced by the floating gate transistor.

The fixed resistor 215 may be, for example, a wire formed of a resistive material. For example, in some embodiments the wire may include Cu, tungsten (W), ruthenium (Ru), tantalum (Ta), or some other material.

Generally, the elements of FIG. 2 may be used in 3D integration of oscillators into an array which is amenable to a batch fabrication. Specifically, the array may be a structure that may be used in an ONN. Generally, the ground and the averager nodes may be routed as vertical columns. Oscillators may be placed over multiple stacked metal interconnect layers. Horizontal wires may connect the oscillators to coupling capacitors.

Figure 3:
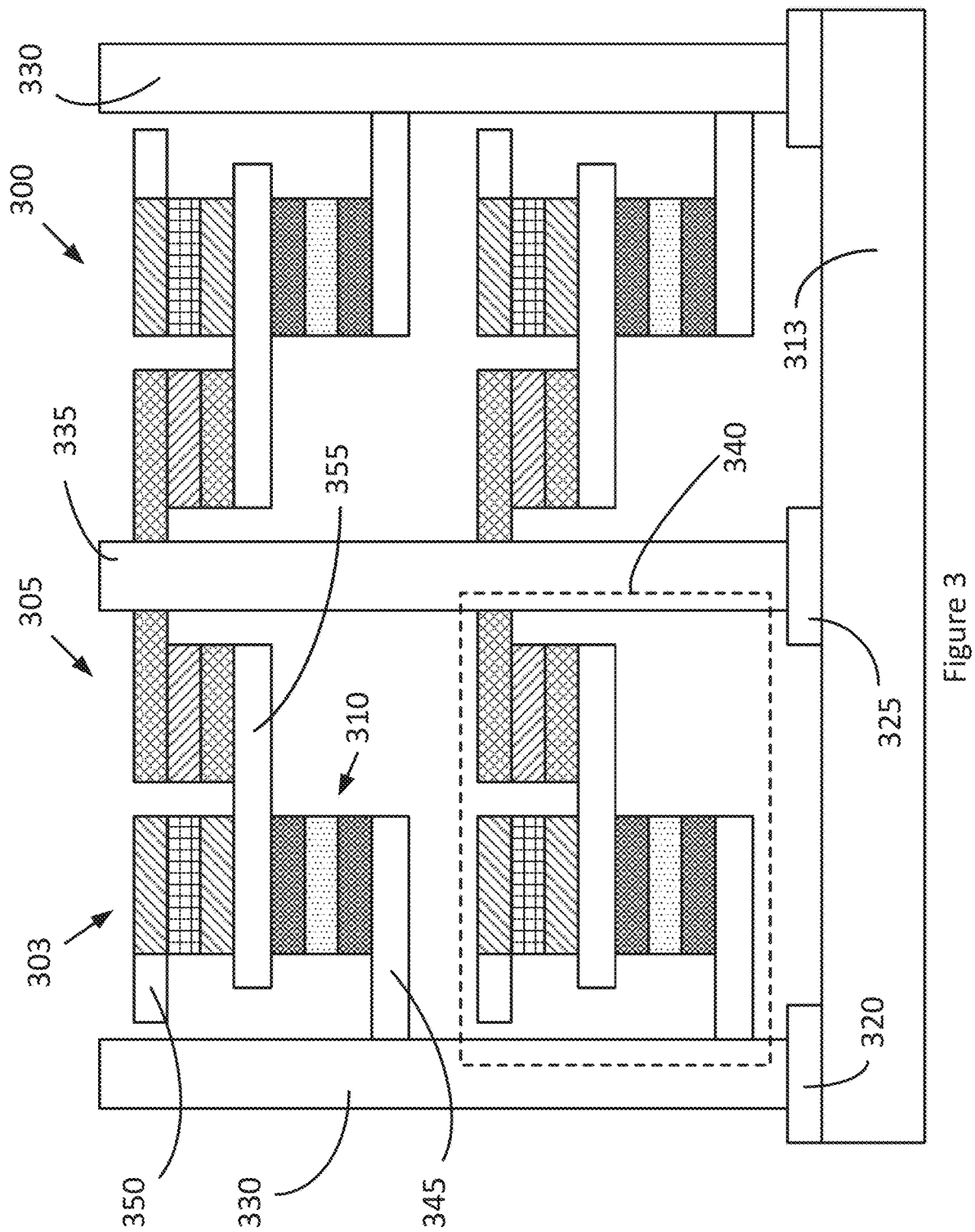
FIG. 3 depicts an example simplified cross-sectional view of a structure to be used in an ONN, in accordance with various embodiments.

FIG. 3 depicts an example of a structure 300 which may include a plurality of oscillators 340. The structure 300 may be appropriate, for example, for use in an ONN. Generally, the structure 300 may include a substrate 313. The substrate 313 may be, for example, a motherboard of a computing device such as a server, an interposer, or some other substrate 313. The substrate 313 may include one or more conductive routing elements such as traces, vias, etc. In some embodiments, the substrate 313 may be cored or coreless, and have one or more electrical interconnects on one or more sides of the substrate 313.

The substrate 313 may be coupled with a plurality of metal plates 320 and 325. The metal plates 320 and 325 may be formed of a conductive material such as copper, gold, etc., and may be electrically coupled with one or more routing elements of the substrate. It will be understood that although the elements shown in FIG. 3 are metal plates 320 and 325, in other embodiments one or more of the metal plates 320 and 325 may be replaced by a different type of electrical interconnect such as a solder bump, a redistribution layer (RDL) line, or some other electrical interconnect. In some embodiments, the metal plates 320/325 may be considered to be "pads" of the substrate 313, while in other embodiments the metal plates 320/325 may be a different type of metal plate.

Respective ones of the metal plates 320 and 325 may be coupled with columns 330 and 335. Generally, as shown in FIG. 3, the columns 330/335 may be parallel with a vertical axis of the structure 300. Specifically, the column 330 may be electrically coupled, by the metal plate 320 and through a conductive element of the substrate 313, with ground. The ground may be similar to ground 150 or 155 of FIG. 1. Similarly, the column 335 may be coupled, by the metal plate 325 and through a conductive element of the substrate 313, with an averager circuit of the ONN. The averager circuit may be, for example, some form of hardware, software, or firmware capable of performing an averaging function for the ONN.

The structure 300 may include a plurality of oscillators 340. Respective ones of the oscillators 340 may include a hysteresis element 303, a capacitor 205, and a variable resistor 310, which may be respectively similar to hysteresis element 203, capacitor 205, and variable resistor 210. The hysteresis element 303 may be coupled with a voltage input 350, and a wordline 355 may communicatively couple the hysteresis element 303, and capacitor 305, and the variable resistor 310 to one another. The voltage input 350 may be similar to input node 110 of FIG. 1, and be configured to provide an input voltage to the oscillator 340. The wordline 355 may be a communicative line that serves one or both of two functions. First, the wordline 355 may electrically couple the hysteresis element 303, the capacitor 305, and the variable resistor 310 to one another. Additionally, the wordline 355 may be coupled with an element external to the structure 300 which may deliver one or more signals to the variable resistor 310. The variable resistor 310 may, based on the received signals, set the resistance value of the variable resistor 310 as described above.

As can be seen, the oscillator 340 may be coupled with the column 335. Specifically, the topmost electrode of the capacitor 305 may be coupled with the column 335. Similarly, the variable resistor 310 may be coupled with a connecting wire 345, which in turn may be electronically coupled with the column 330. It will be understood that the specific configuration and connections of an oscillator 340 of FIG. 3 may generally correspond to the circuit diagram of the oscillator 100 of FIG. 1, and function in a manner similar to that described above with respect to FIG. 1.

Figure 4:
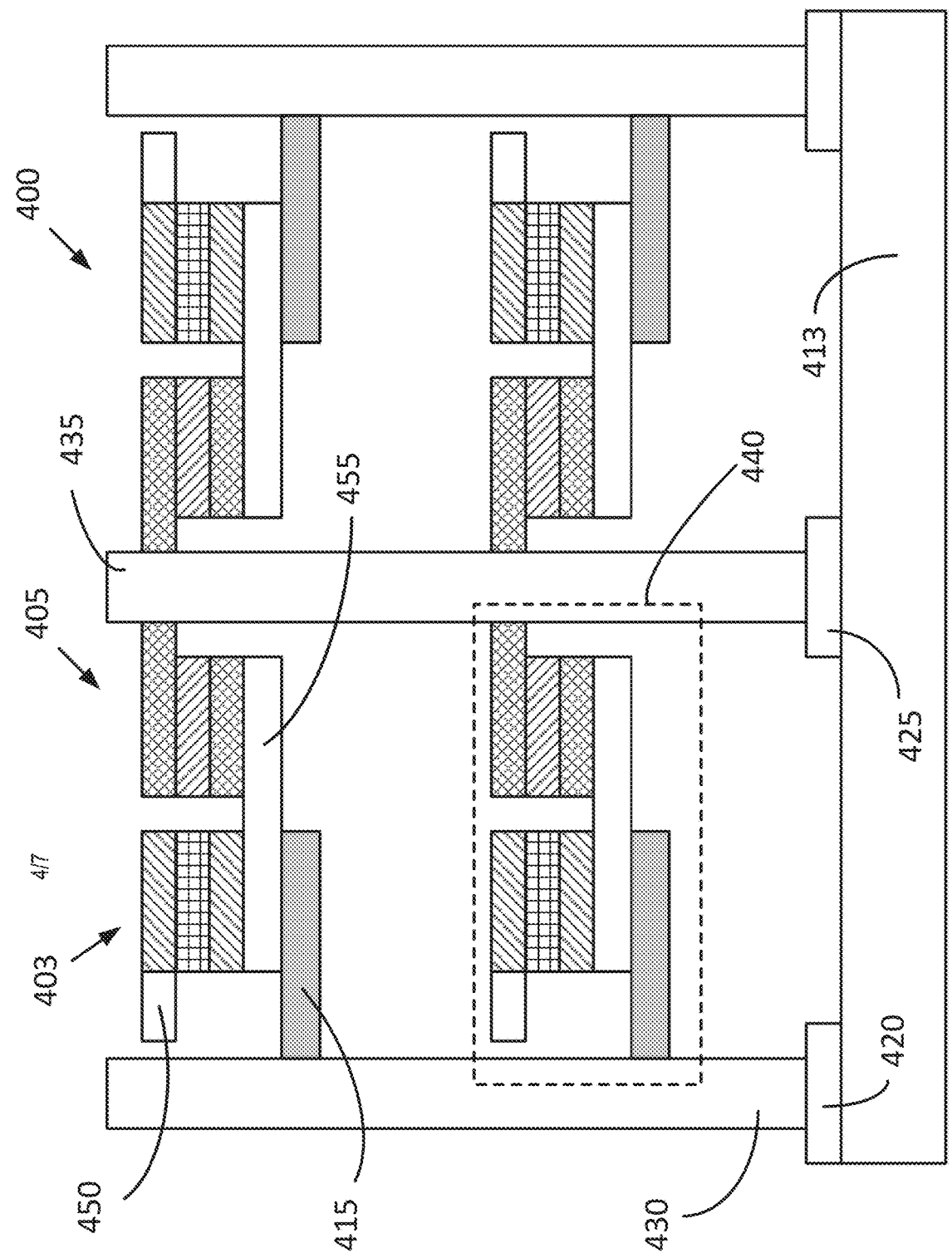
FIG. 4 depicts an alternative example simplified cross-sectional view of a structure to be used in an ONN, in accordance with various embodiments.

FIG. 4 depicts an alternative example simplified cross-sectional view of a structure 400 to be used in an ONN, in accordance with various embodiments. The structure 400 may be similar to structure 300 in many ways. Specifically, the structure 400 may include a substrate 413, metal plates 420 and 425, and columns 430 and 435 which may be respectively similar to substrate 313, metal plates 320/325, and columns 330/335.

The structure 400 may further include an oscillator 440 which may include elements similar to those of oscillator 340. Specifically, the oscillator 440 may include a hysteretic element 403 coupled with a voltage input 450, which may be similar to hysteretic element 303 and voltage input 350. The oscillator may further include a capacitor 405 coupled with column 435, which may be similar to capacitor 305.

The oscillator 440 may further include a fixed resistor 415, which may be similar to fixed resistor 215. The oscillator may further include a wordline 455 that couples the fixed resistor 415 to the hysteretic element 403 and the capacitor 405. In this embodiment, the fixed resistor 415 may have a fixed resistive value. Therefore, the wordline 455 may not be coupled with an external source that is configured to deliver a signal to a variable resistor. Rather, the wordline 455 may be configured to electrically couple the hysteretic element 403, the capacitor 405, and the fixed resistor 415. Similarly to FIG. 3, it will be understood that the specific configuration and connections of an oscillator 440 of FIG. 4 may generally correspond to the circuit diagram of the oscillator 105 of FIG. 1, and function in a manner similar to that described above with respect to FIG. 1.

It will be understood that the structures 300 and 400 may be highly simplified, and other embodiments may have additional elements such as various filters, additional elements such as resistors/capacitors, etc. within the structures 30/4000 or inserted between various elements of the structures 300/400. Additionally, for the sake of clarity of the Figures only certain elements of the Figures are enumerated. It will be understood that un-numbered elements within the Figures may share characteristics with similar numbered elements, even if those elements are not specifically addressed in this description.

Additionally, it will be understood that the Figures are intended as examples, and in other embodiments the structures 300 or 400 may have more or fewer elements than are depicted in FIG. 3 or 4. For example, in some embodiments the structures 300 or 400 may have more or fewer oscillators 340/440 than illustrated in the Figures. In some embodiments, one or more of the columns 330/335/430/435 may be taller/shorter/wider/narrower/etc. than depicted in the Figures. In some embodiments, even though the columns 330/335/430/435 are depicted as perpendicular to the surface of the substrate 413, in other embodiments one or more of the columns may be angled in some manner with respect to the surface or another one of the columns. For example, in some embodiments the oscillators 340/440 may be generally arranged in a vertical pattern while the columns 330/335/430/435 are arranged in a generally horizontal pattern with respect to the surface of the substrate 313/413. Other alternatives may be present in other embodiments.

Figure 5:
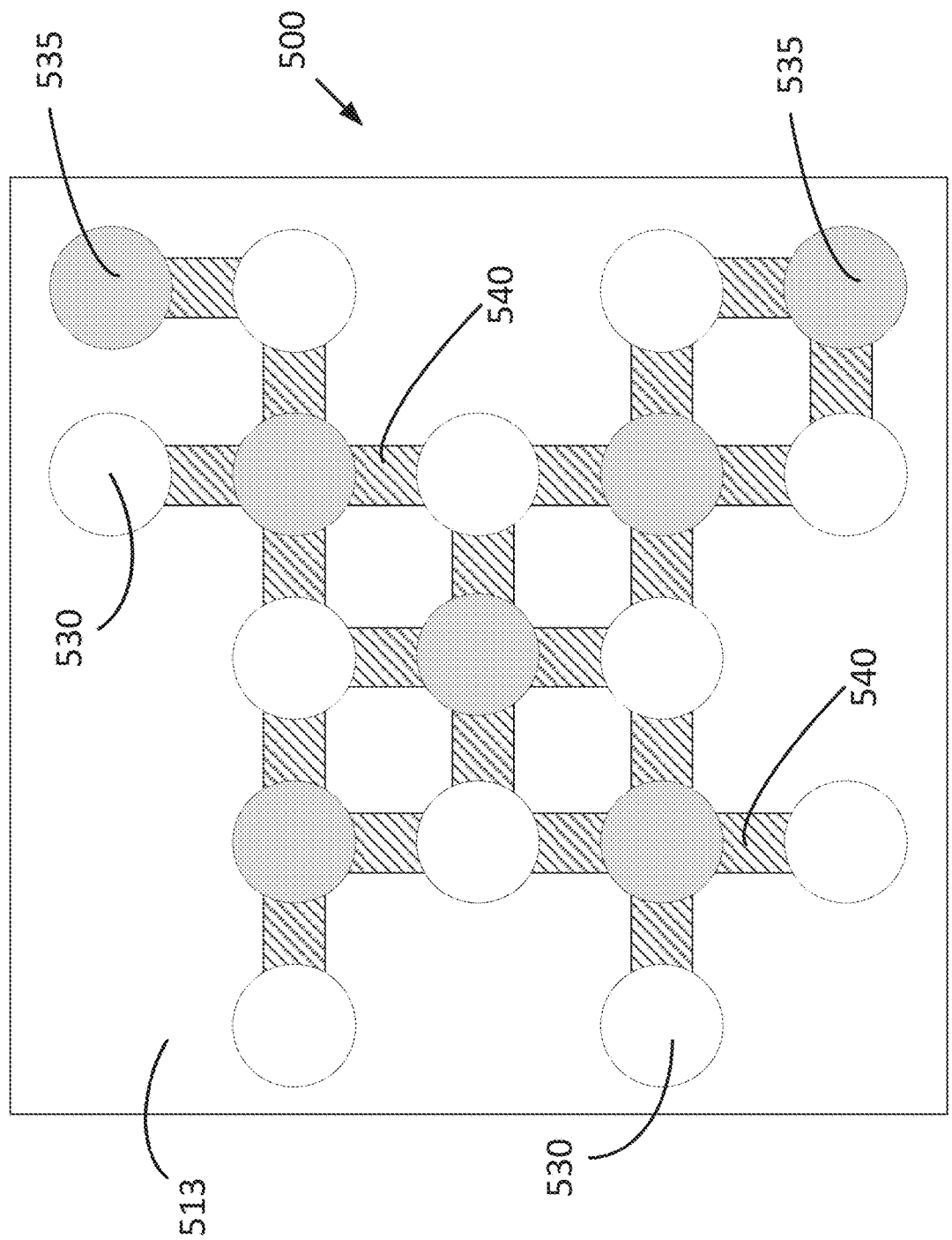
FIG. 5 depicts a simplified top-down view of a structure to be used in an ONN, in accordance with various embodiments.

FIG. 5 depicts a simplified top-down view of a structure 500 to be used in an ONN, in accordance with various embodiments. Specifically, the structure 500 may include a substrate 513, which may be similar to substrates 313/413. The structure 500 may further include a plurality of columns 530 and 535, which may be similar to columns 330/430 and 335/435, respectively. Generally, even though each of the columns in FIG. 5 may not be specifically enumerated, they may be assumed that the columns with the darker shading may be similar to columns 535, and that columns without shading may be similar to columns 530. The structure 500 may further include a plurality of oscillators 540, which may be similar to oscillators 340 or 440.

As can be seen, respective ones of the columns 530 or 535 may be coupled with a plurality of oscillators 540. Specifically, in some embodiments the columns 530, which may correspond to the columns used for coupling to ground in FIG. 3 or 4, may be coupled with one, two, three, or four oscillators 540. Additionally, in some embodiments the columns 535, which may correspond to the columns used for coupling to an averager in FIG. 3 or 4, may be coupled with one, two, three, or four oscillators 540.

It will be understood that the structure 500 is intended as a highly simplified example of a structure which may be used in an ONN. For example, as noted above, an ONN may require on the order of hundreds of oscillators such as oscillators 540. Therefore, in some embodiments the structure 500 may include on the order of tens, hundreds, or thousands of columns 530 or 535. Additionally, it will be understood that in some embodiments the columns 530/535 may not be arranged in a general grid pattern as depicted in FIG. 5. Rather, in some embodiments the columns may be arranged in a curved pattern, a pattern with gaps, a random pattern, or some other pattern. The pattern of the columns 530 or 535 may be based on, for example, workload requirements, size restrictions, cost restrictions, design considerations, or some other factor related to the structure 500. In some embodiments, even though the columns 530/535 are depicted as generally circular, in other embodiments the columns 530/535 may have a cross-section that may be square, rectangular, triangular, or some other cross-section.

Additionally, as can be seen in FIG. 3 or 4, a structure such as structures 300 or 400 may have a plurality of oscillators stacked vertically. Similarly, the structure 500 may have a plurality of oscillators such as oscillators 540 stacked vertically. However, because the structure 500 is a simplified top-down view, only a single oscillator 540 may be shown where a plurality of oscillators are present. It may also be understood that additional filters, resistors, capacitors, metal plates, etc. may be present in the structure of FIG. 5, but may not be depicted for the sake of clarity of the Figure.

FIG. 6 depicts an example technique for generating a structure to be used in an ONN, in accordance with various embodiments. Specifically, FIG. 6 will be described with respect to the structure 300 of FIG. 3. However, it will be understood that the technique described in FIG. 6 may be applied to the structures of FIG. 4, FIG. 5, or some other structure to be used in an ONN with or without modification.

The technique may include coupling, at 605, a first column with a substrate. The column may be similar to, for example, column 335. The substrate may be similar to, for example, substrate 313. Generally, the column may be parallel to a vertical axis of the structure, and the structure may further include a lateral axis that is perpendicular to the vertical axis.

The technique may further include coupling, at 610, a second column to the substrate. The column may be similar to, for example, column 330. In embodiments, the second column may be generally parallel to the first column.

The technique may further include coupling, at 615, a first oscillator to the first column and the second column. The oscillator may be similar to, for example, oscillator 340. The oscillator may be at a first location along the vertical axis of the structure. The technique may further include coupling, and 620, a second oscillator to the first column and the second column, wherein the second oscillator is at a second location along the vertical axis. For example, as can be seen in FIG. 3, two oscillators 340 may be stacked vertically, and coupled with the columns 330 and 335 at different locations along the vertical axis.

It will be understood that this example technique is one example embodiment, and in some embodiments certain of the elements of the technique may be performed in conjunction with one another, or in a different order than depicted in FIG. 6. For example, in some embodiments elements 610 may be performed prior to, or concurrently with, elements 605.

Figure 7:
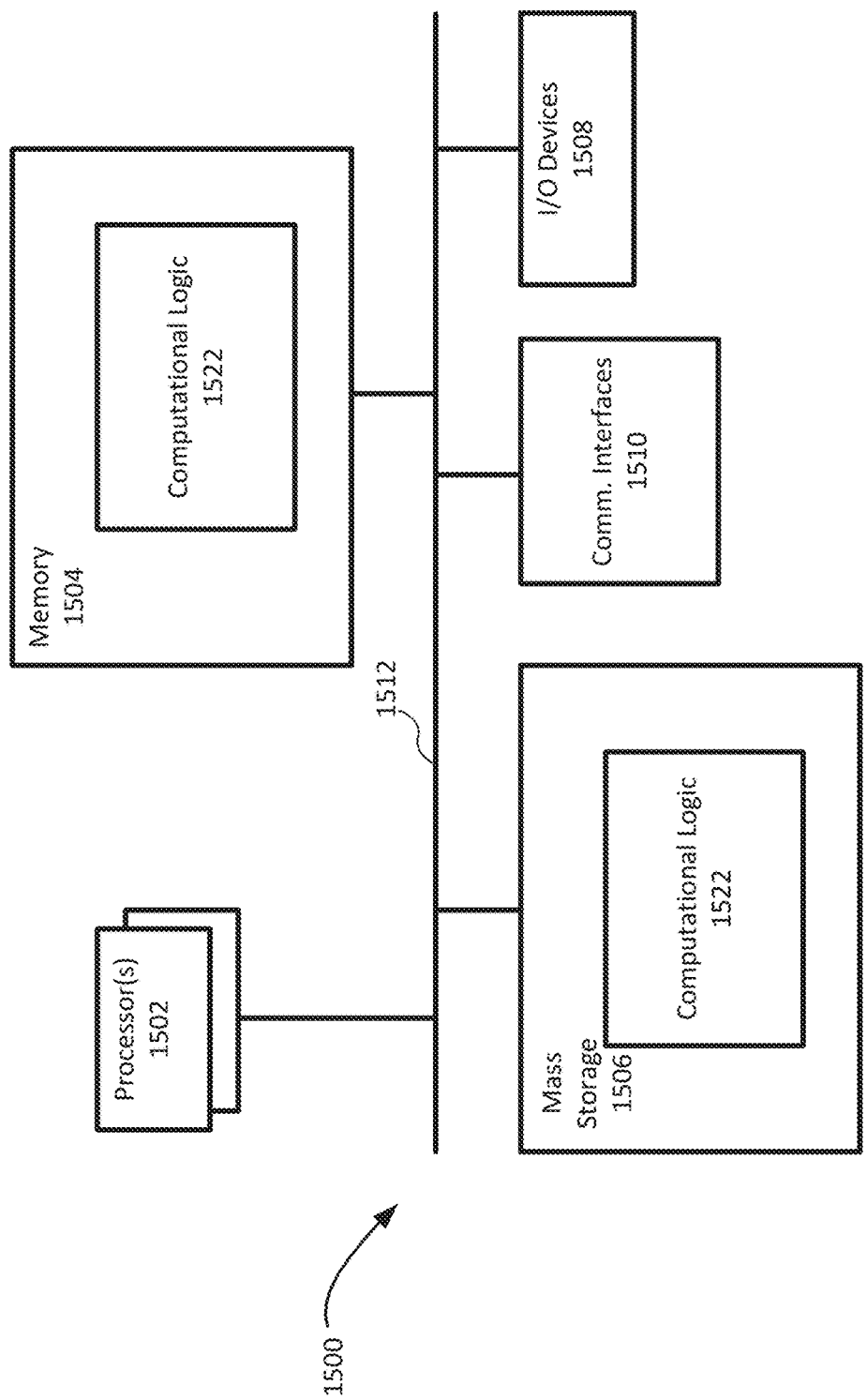
FIG. 7 illustrates an example device that may use various embodiments herein, in accordance with various embodiments.

FIG. 7 illustrates an example computing device 1500 suitable for use with various of the ONNs or oscillators discussed herein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., dynamic random access memory (DRAM), compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid-state mass storage, and so forth. Volatile memory may include, but is not limited to, static and/or DRAM. Non-volatile memory may include, but is not limited to, electrically erasable programmable read-only memory, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example AC, direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, elements of the computing device 1500 may be used in an ONN such as those described herein. For example, the processor(s) 1502 may serve as the averager nodes described herein. Specifically, the processor(s) 1502 may be communicatively coupled with one or more of the pillars 335/435/535. In this way, the processor 1502 may implement the averager node functionality based on the inputs from the oscillators 340/440/540 coupled with the various pillars 335/435/535.

EXAMPLES OF VARIOUS EMBODIMENTS

Example 1 includes a structure to be used in a neural network, wherein the structure comprises: a first column to couple with a face of a substrate, wherein the face of the substrate defines a lateral plane parallel to the face of the substrate and a vertical axis perpendicular to the lateral plane, wherein the first column is parallel to the vertical axis; a second column to couple with the face of the substrate, wherein the second column is parallel to the vertical axis; a capacitor structure electrically coupled with the first column; an insulator-metal transition (IMT) structure electrically coupled with the first column, wherein the capacitor structure is electrically positioned between the IMT structure and the first column; and a resistor structure electrically coupled with the IMT structure and the second column, wherein the resistor structure is electrically positioned between the second column and the IMT structure.

Example 2 includes the structure of example 1, further comprising a voltage line electrically coupled with the IMT structure, wherein the IMT structure is electrically positioned between the voltage line and the capacitor.

Example 3 includes the structure of example 1, wherein the first column is to couple with averaging logic of the neural network.

Example 4 includes the structure of example 1, wherein the second column is to couple with ground of the substrate.

Example 5 includes the structure of any of examples 1-4, wherein the capacitor structure includes a first electrode, a second electrode, and a dielectric material between the first and second electrodes.

Example 6 includes the structure of any of examples 1-4, wherein the IMT structure includes a first electrode, a second electrode, and an oxide material positioned between the first electrode and the second electrode.

Example 7 includes the structure of any of examples 1-4, wherein the resistor structure includes a first electrode and a second electrode and a variable resistor positioned between the first electrode and the second electrode.

Example 8 includes the structure of example 7, wherein the variable resistor is a resistive random-access memory (RRAM), a conductive bridge random-access memory (CBRAM), or a phase change material (PCM).

Example 9 includes the structure of example 7, wherein the variable resistor is a filamentary oxygen vacancy resistive switching material, an interfacial resistive switching material, or a conductive bridge filament material.

Example 10 includes the structure of example 7, further comprising a wordline coupled with the variable resistor, wherein the wordline is to deliver a signal related to a desired resistance setting of the variable resistor.

Example 11 includes the structure of example 7, wherein the variable resistor is a floating gate transistor.

Example 12 includes the structure of any of examples 1-4, wherein the resistor structure includes a wire.

Example 13 includes the structure of example 12, wherein the wire is formed of tungsten (W) or copper (Cu).

Example 14 includes a structure that is a portion of a neural network, wherein the structure comprises: a substrate with a face, wherein the face defines a lateral plane parallel to the face of the substrate and a vertical axis perpendicular to the lateral plane; a first plurality of columns, wherein respective ones of the first plurality of columns are parallel to the vertical axis and are electrically coupled with averaging logic of the neural network; a second plurality of columns, wherein respective ones of the second plurality of columns are parallel to the vertical axis and are electrically coupled with a ground of the substrate; and an oxide oscillator electrically coupled with and electrically positioned between a first column of the first plurality of columns and a second column of the second plurality of columns, wherein the oxide oscillator includes: a capacitor structure electrically coupled with the first column; an insulator-metal transition (IMT) structure electrically coupled with the first column, wherein the capacitor structure is electrically positioned between the IMT structure and the first column; and a resistor structure electrically coupled with the IMT structure and the second column, wherein the resistor structure is electrically positioned between the second column and the IMT structure.

Example 15 includes the structure of example 14, wherein the oxide oscillator is a first oxide oscillator, and further comprising a second oxide oscillator electrically coupled with and electrically positioned between the first column and a third column of the second plurality of columns.

Example 16 includes the structure of example 15, further comprising a first voltage line electrically coupled with the IMT structure of the first oxide oscillator and a second voltage line electrically coupled with the IMT structure of the second oxide oscillator.

Example 17 includes the structure of example 16, wherein the first voltage line and the second voltage line are to deliver a same voltage to the first oxide oscillator and the second oxide oscillator, and wherein the resistor structure of the first oxide oscillator is a variable resistor.

Example 18 includes the structure of example 16, wherein the first voltage line and the second voltage line are to deliver different voltages to the first oxide oscillator and the second oxide oscillator, and wherein the resistor structure of the first oxide oscillator is a constant resistor.

Example 19 includes the structure of example 15, wherein the first oxide oscillator and the second oxide oscillator are coupled with one another by the first column.

Example 20 includes a method of forming a structure for use in a neural network, the method comprising: coupling a first column with a substrate, wherein the column is parallel to a vertical axis of the structure, and wherein the vertical axis is perpendicular to a lateral axis of the structure; coupling a second column to the substrate, wherein the second column is parallel to the first column; coupling a first oscillator to the first column and the second column, wherein the first oscillator is at a first location along the vertical axis; and coupling a second oscillator to the first column and the second column, wherein the second oscillator is at a second location along the vertical axis.

Example 21 includes the method of example 20, wherein the first column is coupled with an averaging logic of the neural network, and the second column is coupled with a ground of the substrate.

Example 22 includes the method of examples 20 or 21, wherein the first oscillator includes: a capacitor structure electrically coupled with the first column; an insulator-metal transition (IMT) structure electrically coupled with the first column, wherein the capacitor structure is electrically positioned between the IMT structure and the first column, and wherein the IMT structure is further electrically coupled with a voltage rail such that the IMT structure is electrically positioned between the voltage rail and the capacitor structure; and a resistor structure electrically coupled with the IMT structure and the second column, wherein the resistor structure is electrically positioned between the second column and the IMT structure.

Example 23 includes the method of example 22, wherein the IMT structure includes an oxide material.

Example 24 includes the method of examples 20 or 21, further comprising: coupling a third column with the substrate; and coupling a third oscillator to the first column and the third column, wherein the third oscillator is as the first location along the vertical axis.

Example 25 includes the method of example 24, further comprising coupling a fourth oscillator to the first column and the third column, wherein the fourth oscillator is at a third location along the vertical axis.

Example 26 includes the method of example 24, wherein the first oscillator, the second oscillator, and the third oscillator are electrically coupled with one another by the first column.

Various embodiments may include any suitable combination of the above-described embodiments including alternative (or) embodiments of embodiments that are described in conjunctive form (and) above (e.g., the "and" may be "or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. An oscillator structure, the oscillator structure comprises:
    a first column;
    a second column parallel to the first column;
    a capacitor structure electrically positioned between an insulator-metal transition (IMT) structure and the first column; and a resistor structure electrically positioned between the IMT structure and the second column.

2. The oscillator structure of claim 1, further comprising a voltage line, wherein the IMT structure is electrically positioned between the voltage line and the capacitor structure.

3. The oscillator structure of claim 1, wherein the first column is configured to be coupled with an averager circuit.

4. The oscillator structure of claim 1, wherein the second column is configured to be coupled with ground.

5. The oscillator structure of claim 1, wherein the capacitor structure includes a first electrode, a second electrode, and a dielectric material between the first and second electrodes.

6. The oscillator structure of claim 1, wherein the IMT structure includes a first electrode, a second electrode, and an oxide material positioned between the first electrode and the second electrode.

7. The oscillator structure of claim 1, wherein the resistor structure includes a first electrode, a second electrode, and a variable resistor positioned between the first electrode and the second electrode.

8. The oscillator structure of claim 7, wherein the variable resistor is a resistive random-access memory (RRAM), a conductive bridge random-access memory (CBRAM), or a phase change material (PCM), a filamentary oxygen vacancy resistive switching material, an interfacial resistive switching material, a conductive bridge filament material, or a floating gate transistor.

9. The oscillator structure of claim 7, further comprising a wordline coupled with the variable resistor, wherein the wordline is configured to deliver a signal related to a desired resistance setting of the variable resistor.

10. The oscillator structure of claim 1, wherein the resistor structure includes a wire.

11. A neural network, comprising:
a first column;
a second column parallel to the first column; and
an oxide oscillator electrically positioned between the first column and the second column, the oxide oscillator including
an insulator-metal transition (IMT) structure electrically coupled with the first column,
a capacitor structure electrically positioned between the IMT structure and the first column, and
a resistor structure electrically positioned between the second column and the IMT structure.

12. The neural network of claim 11, wherein the oxide oscillator is a first oxide oscillator, further comprising a second oxide oscillator electrically positioned between the first column and a third column.

13. The neural network of claim 12, wherein the second column and the third column are coupled with ground.

14. The neural network of claim 12, further comprising a first voltage line electrically coupled with the first oxide oscillator and a second voltage line coupled with the second oxide oscillator.

15. The neural network of claim 12, wherein the first oxide oscillator is coupled with the second oxide oscillator by the first column.

16. The neural network of claim 11, wherein the first column is to couple with an averager circuit.

17. A structure, comprising:
a substrate having a surface;
a first column perpendicular to the surface and electrically coupled with an averager circuit;
a second column perpendicular to the surface and electrically coupled with a ground of the substrate; and
an oxide oscillator electrically positioned between the first column and the second column, the oxide oscillator comprising:
a capacitor structure electrically positioned between an insulator-metal transition (IMT) structure and the first column, and
a resistor structure electrically positioned between the IMT structure and the second column.

18. The structure of claim 17, further comprising an additional oxide oscillator that is electrically positioned between the first column and a third column, wherein the third column is perpendicular to the surface and electrically coupled with the ground of the substrate.

19. The structure of claim 18, wherein the additional oxide oscillator includes an additional IMT structure electrically coupled with the first column.

20. The structure of claim 19, further comprising:
a first voltage line electrically coupled with the IMT structure; and
a second voltage line electrically coupled with the additional IMT structure.

* * * * *